United States Patent
Rabaa et al.

(10) Patent No.: US 11,601,119 B2
(45) Date of Patent: Mar. 7, 2023

(54) RADIATION HARDENED FLIP-FLOP CIRCUIT FOR MITIGATING SINGLE EVENT TRANSIENTS

(71) Applicant: The Boeing Company, Chicago, IL (US)

(72) Inventors: Salim A. Rabaa, Lake Forest Park, WA (US); Ethan H. Cannon, Seattle, WA (US); Manuel F. Cabanas-Holmen, McKenna, WA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 17/552,739

(22) Filed: Dec. 16, 2021

(65) Prior Publication Data

US 2022/0200585 A1 Jun. 23, 2022

Related U.S. Application Data

(60) Provisional application No. 63/127,571, filed on Dec. 18, 2020.

(51) Int. Cl.
*H03K 3/037* (2006.01)
*H03K 3/3562* (2006.01)

(52) U.S. Cl.
CPC ....... *H03K 3/0375* (2013.01); *H03K 3/35625* (2013.01)

(58) Field of Classification Search
CPC .... H03K 3/012; H03K 3/0372; H03K 3/0375; H03K 3/3562; H03K 3/35625
See application file for complete search history.

(56) References Cited

U.S. PATENT DOCUMENTS

| | | | |
|---|---|---|---|
| 8,754,701 B2* | 6/2014 | Cannon | H03K 17/162 327/144 |
| 8,847,621 B2* | 9/2014 | Cannon | H03K 19/20 326/15 |
| 9,013,219 B2 | 4/2015 | Cabanas-Holmen et al. | |
| 10,998,890 B2* | 5/2021 | Li | H03K 19/0033 |

* cited by examiner

*Primary Examiner* — Patrick O Neill
(74) *Attorney, Agent, or Firm* — Vivacqua Crane, PLLC

(57) ABSTRACT

A flip-flop circuit comprises a pass gate, a feedback inverter, and an interleaved filter. The pass gate comprises a clock input and an inverting clock input. The feedback inverter includes a feedback input coupled to both the clock input and the inverting clock input of the pass gate. The interleaved filter comprises a delay circuit including a delay output, a C-gate element, and a blocking inverter. The C-gate element includes a C-gate input and a C-gate output. The C-gate input is coupled to the delay output of the delay circuit and the pass gate, and the C-gate output is coupled to the feedback input of the feedback inverter. The blocking inverter includes a blocking input and a blocking output. The blocking input is coupled to the delay output of the delay circuit, and the blocking output is coupled to the feedback input of the feedback inverter.

20 Claims, 4 Drawing Sheets

RADIATION HARDENED FLIP-FLOP CIRCUIT FOR MITIGATING SINGLE EVENT TRANSIENTS

CROSS-REFERENCE TO RELATED APPLICATION

This application claims priority to U.S. Provisional Application No. 63/127,571, filed Dec. 18, 2020. The contents of the application are incorporated herein by reference in its entirety.

INTRODUCTION

The present disclosure relates to a radiation hardened flip-flop circuit. In particular, the present disclosure is directed towards a radiation hardened flip-flop circuit that includes an interleaved filter and a feedback inverter, where the feedback inverter mitigates single event transients (SETs) that occur within the interleaved filter.

BACKGROUND

There is an ongoing demand for decreasing the power density, especially in high performance digital application specific integrated circuits (ASIC) as well as mixed-signal system-on-chip (SOC) that are used in space applications. As a result, various spatial and redundancy techniques used to mitigate single event effects (SEE) caused by energetic particles may exacerbate these power density concerns. A single event upset (SEU) is a radiation-induced error that is caused when charged particles (usually from the radiation belts or from cosmic rays) lose energy by ionizing the medium through which they pass. A SEE in a flip-flop may flip the data stored in a flip-flop, causing a SEU. It is to be appreciated that a SEE in logic gates creates single event transients (SETs) that may be captured by flip-flops.

Spatial redundancy techniques may be used to reduce susceptibility to SEUs. For example, a triple modular redundancy (TMR) flip-flop may provide improved SEU tolerance. In this approach, three flip-flops hold copies of the data, and a majority voter may overcome an upset in a flip-flop. However, this approach also requires three times as much power as an unhardened flip-flop. In addition to spatial redundancy techniques, transient filters may also be used to reduce or eliminate transients that are generated in the logic preceding the flip-flop. However, the addition of one or more redundant flip-flops and transient filters also increases power consumption and reduces performance significantly.

In another approach, a radiation hardened interleaved filter may be used to mitigate SEUs that are caused by events in the flip-flop as well as SETs due to events in the data path. The interleaved filter does not create a SET unless a radiation particle interacts with both nodes that are part of the interleaved filter. However, this type of filtered flip-flop is designed for silicon-on-insulator (SOI) technologies and may not be effective with devices that do not include a buried insulating layer, such as bulk fin field-effect transistor (FinFET) technologies.

SUMMARY

According to several aspects, a flip-flop circuit is disclosed. The flip-flop circuit comprises a pass gate, a feedback inverter, and an interleaved filter. The pass gate comprises a clock input and an inverting clock input. The feedback inverter includes a feedback input coupled to both the clock input and the inverting clock input of the pass gate. The interleaved filter comprises a delay circuit including a delay output, a C-gate element, and a blocking inverter. The C-gate element includes a C-gate input and a C-gate output, where the C-gate input is coupled to the delay output of the delay circuit, and the C-gate output is coupled to the feedback input of the feedback inverter. The blocking inverter includes a blocking input and a blocking output, where the blocking input is coupled to the delay output of the delay circuit, and the blocking output is coupled to the feedback input of the feedback inverter.

In another aspect, a method for blocking a single event transient (SET) in a flip-flop circuit is disclosed. The method comprises sending, by a C-gate element, a first signal to a feedback inverter, where the C-gate element includes a C-gate input and a C-gate output. The method includes sending, by a blocking inverter, a second signal to the feedback inverter, where the blocking inverter includes a blocking input and a blocking output, and where the blocking input of the blocking inverter and the C-gate input are both coupled to a delay output of a delay circuit. The method further comprises comparing, by the feedback inverter, the first signal with the second signal, where a feedback input of the feedback inverter is coupled to the C-gate output of the C-gate element and the blocking output of the blocking inverter. In response to determining the first signal and the second signal are different from one another, the method includes blocking the first signal and the second signal from passing to the C-gate element and the delay circuit.

The features, functions, and advantages that have been discussed may be achieved independently in various embodiments or may be combined in other embodiments further details of which can be seen with reference to the following description and drawings.

BRIEF DESCRIPTION OF THE DRAWINGS

The drawings described herein are for illustration purposes only and are not intended to limit the scope of the present disclosure in any way.

DETAILED DESCRIPTION

A radiation hardened flip-flip circuit for mitigating single event transients (SETs) is disclosed. The flip-flop circuit includes an interleaved filter coupled to a feedback inverter. The interleaved filter includes a delay circuit, an output C-gate element, and a blocking inverter. The feedback inverter is configured to prevent transients generated at either the output C-gate element or the blocking inverter of the interleaved filter from propagating throughout the flip-flop circuit. The C-gate element includes an input and an output, where the input of the output C-gate element is coupled to an output of the delay circuit and a pass gate of the flip-flop circuit, and the output of the output C-gate element is coupled to an input of the feedback inverter. The blocking inverter includes a blocking input and a blocking output. The blocking input of the blocking inverter is coupled to the output of the delay circuit, and the blocking output of the blocking inverter is coupled to the input of the feedback inverter.

The feedback inverter compares respective outputs from the output C-gate element and the blocking inverter. The respective outputs are allowed to pass in response to the feedback inverter determining the respective outputs match one another. Likewise, the feedback inverter blocks the respective outputs from passing when the respective outputs are different from one another. Accordingly, transients created in either the blocking inverter or the output C-gate element are blocked and may not propagate through the flip-flop circuit and be captured as single event upsets (SEUs).

The following description is merely exemplary in nature and is not intended to limit the present disclosure, application, or uses.

Figure 1:
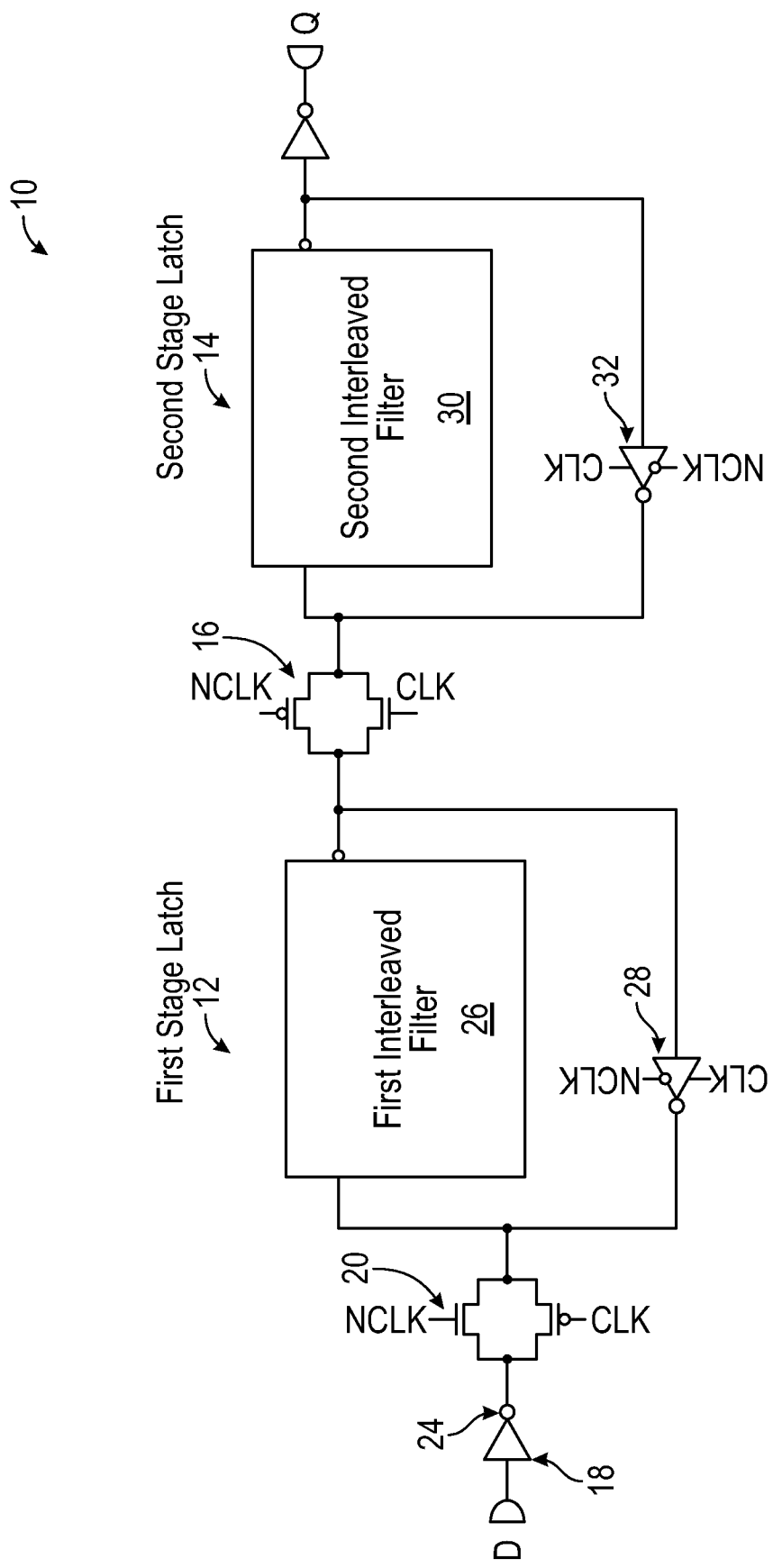
FIG. 1 is a block diagram of the disclosed flip-flop circuit, according to an exemplary embodiment.

Referring to FIG. 1, a block diagram of a radiation hardened flip-flop circuit 10 comprising two radiation hardened latches 12, 14 is shown. Specifically, the flip-flop circuit 10 is a multi-stage circuit including a first stage latch 12 and a second stage latch 14, where a switching device 16 (e.g. pass gate 16) couples the first stage latch 12 to the second stage latch 14. In an embodiment, the switching device 16 is a pass gate configured to pass a logic level from the first stage latch 12 to the second stage latch 14. The flip-flop circuit 10 also includes an input buffer 18 coupled to a pass gate 20, where the pass gate 20 of the flip-flop circuit 10 is coupled to an output 24 of the input buffer 18. The first stage latch 12 includes a first interleaved filter 26 and a first feedback inverter 28. Similarly, the second stage latch 14 includes a second interleaved filter 30 and a second feedback inverter 32. As explained below, the disclosed flip-flop circuit 10 is configured to mitigate sensitivity to SETs, while consuming less power when compared to conventional single event effects mitigated logic circuits.

Figure 2:
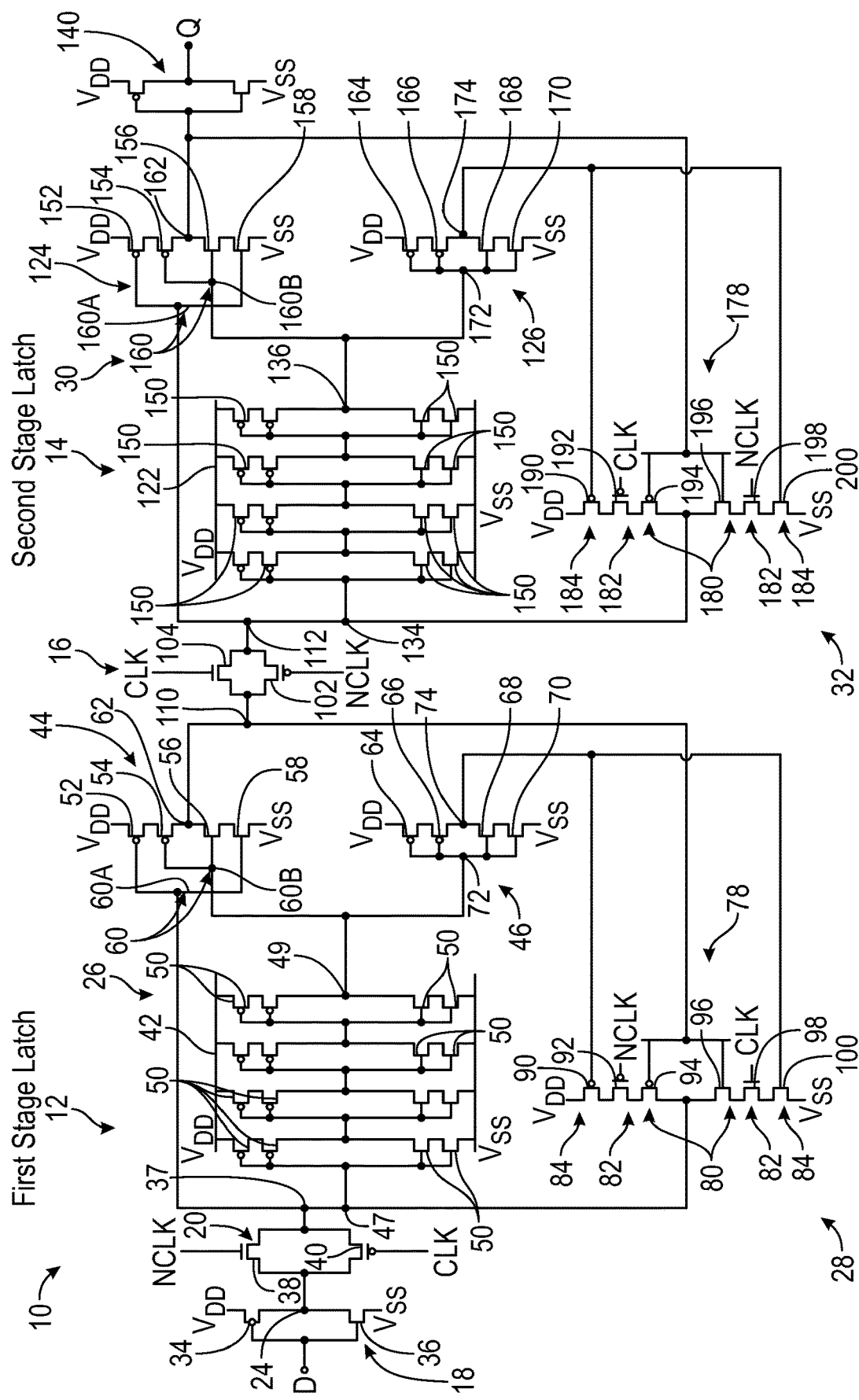
FIG. 2 is a schematic diagram of the flip-flop circuit shown in FIG. 1, where the flip-flop circuit includes a first stage and a second stage, according to an exemplary embodiment.

FIG. 2 is a schematic diagram of the flip-flop circuit 10 shown in FIG. 1, where various transistors are illustrated. Referring to FIG. 2, in an embodiment the input buffer 18 is an inverter comprising a pair of transistors 34, 36. In one embodiment, the transistors 34, 36 are a pair of complementary metal-oxide-semiconductor field-effect transistor (MOSFETs). For example, in an embodiment the transistor 34 is a p-type transistor, such as a p-type MOSFET, and the transistor 36 is an n-type transistor, such as a n-type MOSFET. The transistor 34 of the input buffer 18 is coupled to a drain voltage supply VDD, while the transistor 36 of the input buffer 18 is coupled to a source voltage supply VSS. The pass gate 20 is coupled to the output 24 of the input buffer 18 and an input 37 of the first stage latch 12. In an embodiment, the pass gate 20 comprises two transistors 38, 40. In one embodiment, the transistor 38 is a n-type transistor, such as a n-type MOSFET, and the transistor 40 is an p-type transistor, such as a p-type MOSFET. The transistor 38 of the pass gate 20 is coupled to an inverting clock input NCLK and the transistor 40 of the pass gate 20 is coupled to a clock input CLK. The pass gate 20 is configured to pass an output of the input buffer 18 to the first stage latch 12 of the flip-flop circuit 10.

Referring to both FIGS. 1 and 2, the first interleaved filter 26 includes a first delay circuit 42, a first C-gate element 44, and a first blocking inverter 46. The first interleaved filter 26 is configured to cut off transients that originate from logic proceeding the flip-flop circuit 10 when the inverted clock signal NCLK of the pass gate 20 is at a high logic level, any transients generated in the pass gate 20, and any transients generated in the first feedback inverter 28. As explained below, the first feedback inverter 28 is configured to cut off transients that originate in either the first C-gate element 44 or the first blocking inverter 46 of the first interleaved filter 26 from propagating through the flip-flop circuit 10.

In an embodiment, the first delay circuit 42 includes a first delay input 47, a first delay output 49, and plurality of transistors 50. In the exemplary embodiment as shown in FIG. 2, the plurality of transistors 50 are transistor delay elements that are connected in series. In one embodiment, the transistors 50 are configured to provide a delay of fixed duration, where the delay is a function of process, voltage, and temperature. However, in another embodiment, the first delay circuit 42 provides a delay having a selectable duration. For example, in another embodiment, an output of each transistor 50 is coupled to an input of a multiplexer and to an input of a subsequent transistor delay element. The selectable delay of the transistors 50 may be selected during the design phase of the flip-flop circuit 10, where the selectable delay is a function of process, voltage, and temperature.

The first C-gate element 44 is constructed of two p-type transistors 52, 54 and two n-type transistors 56, 58 that are connected to another in series. The first C-gate element 44 also includes a C-gate input 60 comprising two separate inputs 60A, 60B, where each input 60A, 60B controls one p-type transistor 52, 54 and one n-type transistor 56, 58. For example, the first input 60A controls the p-type transistor 52 and the n-type transistor 58, and the second input 60B controls the p-type transistor 54 and the n-type transistor 56. The first C-gate element 44 is coupled to the input 37 of the first stage latch 12 and the first delay output 49 of the first delay circuit 42. Specifically, one of the inputs 60A of the first C-gate element 44 is coupled to the input 37 of the first stage latch 12, and the remaining second input 60B of the first C-gate element 44 is coupled to the first delay output 49 of the first delay circuit 42. The first C-gate element 44 also includes a first C-gate output 62. The first C-gate output 62 is coupled to the first feedback inverter 28 and an output 110 of the first stage latch 12.

The first blocking inverter 46 is constructed of two p-type transistors 64, 66 connected in series and two n-type transistors 68, 70 also connected in series. The first blocking inverter 46 also includes a first blocking input 72 and a first blocking output 74. The first blocking input 72 of the first blocking inverter 46 is coupled to the first delay output 49 of the first delay circuit 42. The first blocking output 74 of the first blocking inverter 46 is coupled to the first feedback inverter 28. The transistors 64, 66, 68, and 70 of the first blocking inverter 46 are configured to match the delay of the first C-gate element 44. That is, the first C-gate element 44 and the first blocking inverter 46 are configured to have respective matching delays.

The first feedback inverter 28 includes a feedback input 78 comprising of three pairs of transistors 80, 82, 84. Each pair of transistors 80, 82, 84 includes a p-type transistor and an n-type transistor. Specifically, a first pair of transistors 80 of the first feedback inverter 28 includes a p-type transistor 94 and a n-type transistor 96, a second pair of transistors 82 includes a p-type transistor 92 and an n-type transistor 98, and a third pair of transistors 84 includes a p-type transistor 90 and a n-type transistor 100. The first pair of transistors 80 are coupled to the first C-gate output 62 of the first C-gate element 44, the second pair of transistors 82 are coupled to the clock input CLK and the inverted clock input NCLK of the flip-flop circuit 10, and the third pair of transistors 84 are coupled to the first blocking output 74 of the first blocking inverter 46. Specifically, the p-type transistor 94 and the n-type transistor 96 of the first pair of transistors 80 are coupled to the first C-gate output 62 of the first C-gate element 44. The p-type transistor 92 of the second pair of transistors 82 is coupled to the inverting clock input NCLK of the pass gate 20, while the n-type transistor 98 of the second pair of transistors 82 is coupled to the clock input CLK of the pass gate 20. The p-type transistor 90 and the n-type transistor 100 of the third pair of transistors 84 are coupled to the first blocking output 74 of the first blocking inverter 46. It is to be appreciated that the arrangement of transistors 90, 92, 94, 96, 98, 100 illustrated in FIG. 2 is merely exemplary in nature. For example, in another embodiment, the first pair of transistors 80 are coupled to the first blocking inverter 46, the second pair of transistors 82 are coupled to the first C-gate element 44, and the third pair of transistors 84 are coupled to the clock input CLK and the inverted clock input NCLK of the flip-flop circuit 10.

Operation of the first C-gate element 44 is now described. The output of the pass gate 20 is sent to the first input 60A of the first C-gate element 44, and the output generated by the first delay circuit 42 is sent to the second input 60B of the first C-gate element 44. When the first input 60A and the second input 60B of the first C-gate element 44 match, the first C-gate element 44 acts as an inverter. However, when the first input 60A and the second input 60B of the first C-gate element 44 do not match, the first C-gate element 44 drives the first C-gate output 62 to a high impedance state. In other words, the first C-gate output 62 maintains the current value when the respective inputs 60A, 60B of the first C-gate element 44 do not match one another.

It is to be appreciated that the first interleaved filter 26 is not effective at mitigating SETs generated in the first C-gate element 44. Specifically, for example, if the disclosed flip-flop circuit 10 is fabricated using bulk fin field-effect transistor (FinFET) technology, then the flip-flop circuit 10 does not include a buried insulating layer that is present when employing silicon-on-insulator (SOI) technologies. Since there is no buried insulating layer, the first C-gate element 44 may be a source of SETs that are captured as SEUs. Specifically, once the SET propagates through the first feedback inverter 28 and the first interleaved filter 26 to both respective inputs 60A, 60B of the first C-gate element 44, an SEU is created.

The first feedback inverter 28 is configured to compare the respective outputs from the first C-gate element 44 and the first blocking inverter 46 with one another and allows the respective outputs to pass if the values match one another. In response to determining the respective outputs match one another, the first feedback inverter 28 allows the respective outputs to pass to the respective inputs 47, 60A of the first delay circuit 42 and the first C-gate element 44 when the CLK input to the flip-flop circuit 10 is high and the NCLK input to the flip-flop circuit 10 is low. Similarly, in response to determining the respective outputs are different from one another, the first feedback inverter 28 blocks the respective outputs from passing to the respective inputs 47, 60A of the first delay circuit 42 and the first C-gate element 44. In other words, the first feedback inverter 28 only passes the first output 62 of the first C-gate element 44 and the first blocking output 74 of the first blocking inverter 46 when the inputs to all of the transistors 90, 92, 94, 96, 98, 100 of the first feedback inverter 28 match.

Figure 3:
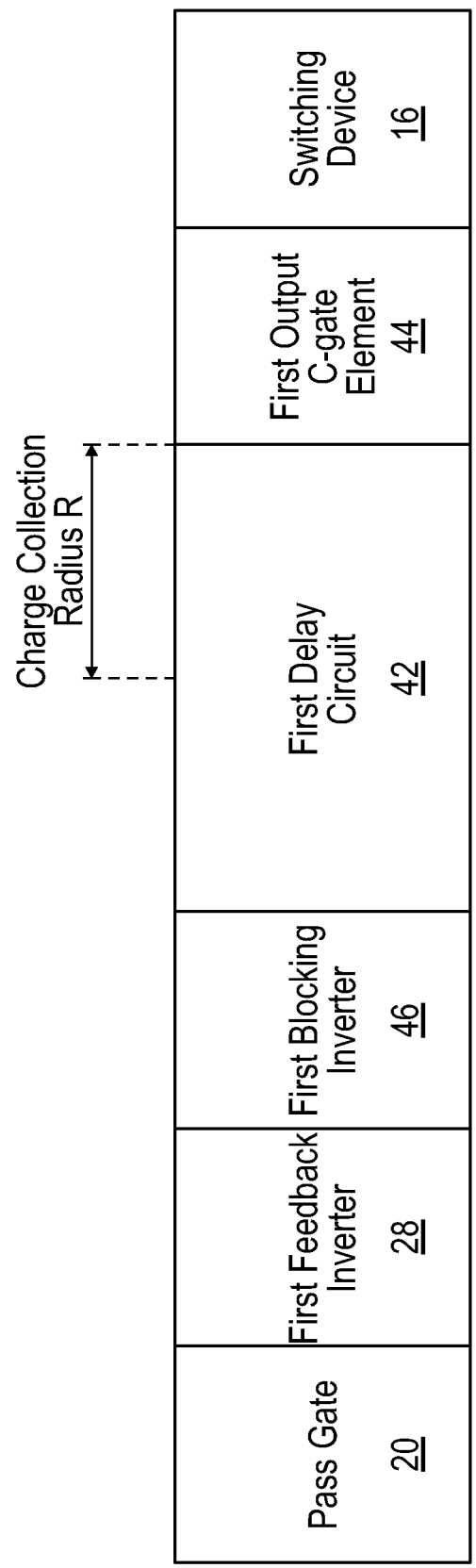
FIG. 3 is a layout diagram of the first stage of the flip-flop circuit, according to an exemplary embodiment.

FIG. 3 is a conceptual diagram illustrating an exemplary layout of the various elements of the first stage latch 12 of the flip-flop circuit 10. Although FIG. 3 illustrates the first stage latch 12, it is to be appreciated that the layout also applies to the elements of the second stage latch 14 as well. In the non-limiting embodiment as shown in FIG. 3, the pass gate 20 is situated to the far left, directly adjacent to the first feedback inverter 28. The first feedback inverter 28 is situated between the pass gate 20 and the first blocking inverter 46. The first blocking inverter 46 is situated between the first feedback inverter 28 and the first delay circuit 42. The first delay circuit 42 is situated between the first blocking inverter 46 and the first C-gate element 44. The first C-gate element 44 is situated between the first delay circuit 42 and the switching device 16, and the switching device 16 is situated to the far right of FIG. 3. It is to be appreciated that the layout shown in FIG. 3 is merely exemplary in nature, and other arrangements may be used as well.

The first C-gate element 44 is spatially separated from the first blocking inverter 46 by at least twice a charge collection radius R of a radiation event occurring in either the first C-gate element 44 or the first blocking inverter 46. Accordingly, the radiation event does not affect both the first C-gate element 44 and the first blocking inverter 46 at the same time. In other words, because the first C-gate element 44 and the first blocking inverter 46 are spatially separated from one another by a distance at least twice the charge collection radius R, the radiation event is unable to strike both the first C-gate element 44 and the first blocking inverter 46 simultaneously.

Referring back to FIG. 2, the first stage latch 12 is coupled to the second stage latch 14 of the flip-flop circuit 10 by the switching device 16. The switching device 16 includes of a pair of transistors 102 and 104. The transistor 102 is a p-type transistor, such as a p-type MOSFET, and the transistor 104 is an n-type transistor, such as n-type MOSFET. The transistor 102 of the switching device 16 is coupled to an inverting clock input NCLK and the transistor 104 of the switching device 16 is coupled to a clock input CLK.

The switching device 16 is configured to pass an output of the first stage latch 12 to the second stage latch 14 of the flip-flop circuit 10. Specifically, in the embodiment as shown in FIG. 2, the output 110 of the first stage latch 12 is coupled to an input 112 of the second stage latch 14. The second interleaved filter 30 of the second stage latch 14 of the flip-flop circuit 10 includes a second delay circuit 122, a second C-gate element 124, and the second blocking inverter 126. The second interleaved filter 30 is configured to cut off transients generated within the first stage latch 12 when the clock signal CLK of the switching device 16 is high, any transients generated in the switching device 16 when passing the logic level from the first stage latch 12 to the second stage latch 14 of the flip-flop circuit 10, and transients generated by the second feedback inverter 32. The second feedback inverter 32 is configured to cut off transients that originate in either the second C-gate element 124 or the second blocking inverter 126 of the second interleaved filter 30. Specifically, the second feedback inverter 32 is configured to only pass a signal when the respective outputs from both the second C-gate element 124 and the second blocking inverter 126 match one another.

In an embodiment, the second delay circuit 122 includes a second delay input 134, a second delay output 136, and plurality of transistors 150 that are connected to one another in series. In an embodiment, the plurality of transistors 150 of the second delay circuit 122 are configured to provide a delay having a fixed duration, where the delay is a function of process, voltage, and temperature. Alternatively, in another embodiment, the second delay circuit 122 provides a delay having a selectable duration. The second C-gate element 124 is a C-gate element constructed of two p-type transistors 152, 154 and two n-type transistors 156, 158 that are connected to another in series. The second C-gate element 124 also includes a second C-gate input 160 comprising two separate inputs 160A, 160B, where each input 160A, 160B controls one p-type transistor 152, 154 and one n-type transistor 156, 158. For example, a first input 160A controls the p-type transistor 152 and the n-type transistor 158, and a second input 160B controls the p-type transistor 154 and the n-type transistor 156.

The second C-gate element 124 is coupled to the input 112 of the second stage latch 14 of the switching device 16 as well as the second delay output 136 of the second delay circuit 122. As seen in FIG. 2, the first input 160A of the second C-gate element 124 is coupled to the input 112 of the second stage latch 14, and the second input 160B of the second C-gate element 124 is coupled to the second delay output 136 of the second delay circuit 122. A second output 162 of the second C-gate element 124 is coupled to the second feedback inverter 32 and an inverter 140.

Continuing to refer to FIG. 2, the second blocking inverter 126 is constructed of two p-type transistors 164, 166 connected in series and two n-type transistors 168, 170 also connected in series. The second blocking inverter 126 further includes a second blocking input 172 and a second blocking output 174. The second blocking input 172 of the second blocking inverter 126 is coupled to the second delay output 136 of the second delay circuit 122. The second blocking output 174 of the second blocking inverter 126 is coupled to the second feedback inverter 32. The second C-gate element 124 and the second blocking inverter 126 are configured to have respective matching delays.

The second feedback inverter 32 includes a second feedback input 178 comprising three pairs of transistors 180, 182, 184. Each pair of transistors 180, 182, 184 includes a p-type transistor and an n-type transistor. Specifically, a first pair of transistors 180 includes a p-type transistor 194 and a n-type transistor 196, a second pair of transistors 182 includes a p-type transistor 192 and an n-type transistor 198, and a third pair of transistors 184 includes a p-type transistor 190 and a n-type transistor 200. In the exemplary embodiment as shown in FIG. 2, the first pair of transistors 180 are coupled to the second output 162 of the second C-gate element 124, the second pair of transistors 182 are coupled to the inverting clock input NCLK and the clock input CLK of the flip-flop circuit 10, and the third pair of transistors 184 are coupled to the second blocking output 174 of the second blocking inverter 126. Specifically, the p-type transistor 194 and the n-type transistor 196 of the first pair of transistors 180 are coupled to the second output 162 of the second C-gate element 124. The p-type transistor 192 of the second pair of transistors 182 is coupled to the clock input CLK of the flip-flop circuit 10, while the n-type transistor 198 of the second pair of transistors 182 is coupled to the inverting clock input NCLK. The p-type transistor 190 and the n-type transistor 200 of the third pair of transistors 184 are coupled to the second blocking output 174 of the second blocking inverter 126.

The output of the switching device 16 is sent to the first input 160A of the second C-gate element 124, and the output generated by the second delay circuit 122 is sent to the second input 160B of the second C-gate element 124. When the first input 160A and the second input 160B of the second C-gate element 124 match, the second C-gate element 124 acts as an inverter. However, when the inputs 160A, 160B of the second C-gate element 124 do not match, the second C-gate element 124 drives the second output 162 of the second C-gate element 124 to a high impedance state.

Similar to the first feedback inverter 28 of the first stage latch 12, the second feedback inverter 32 compares the respective outputs from the second C-gate element 124 and the second blocking inverter 126 with one another. In response to determining the respective outputs match one another, the second feedback inverter 32 allows the respective outputs to pass to the respective inputs 134, 160A of the second delay circuit 122 and the second C-gate element 124 when the CLK input to the flip-flop circuit 10 is low and the inverted clock input NCLK is high. Similarly, in response to determining the respective outputs are different from one another, the second feedback inverter 32 blocks the respective outputs from passing to the respective inputs 134, 160A of the second delay circuit 122 and the second C-gate element 124.

Figure 4:
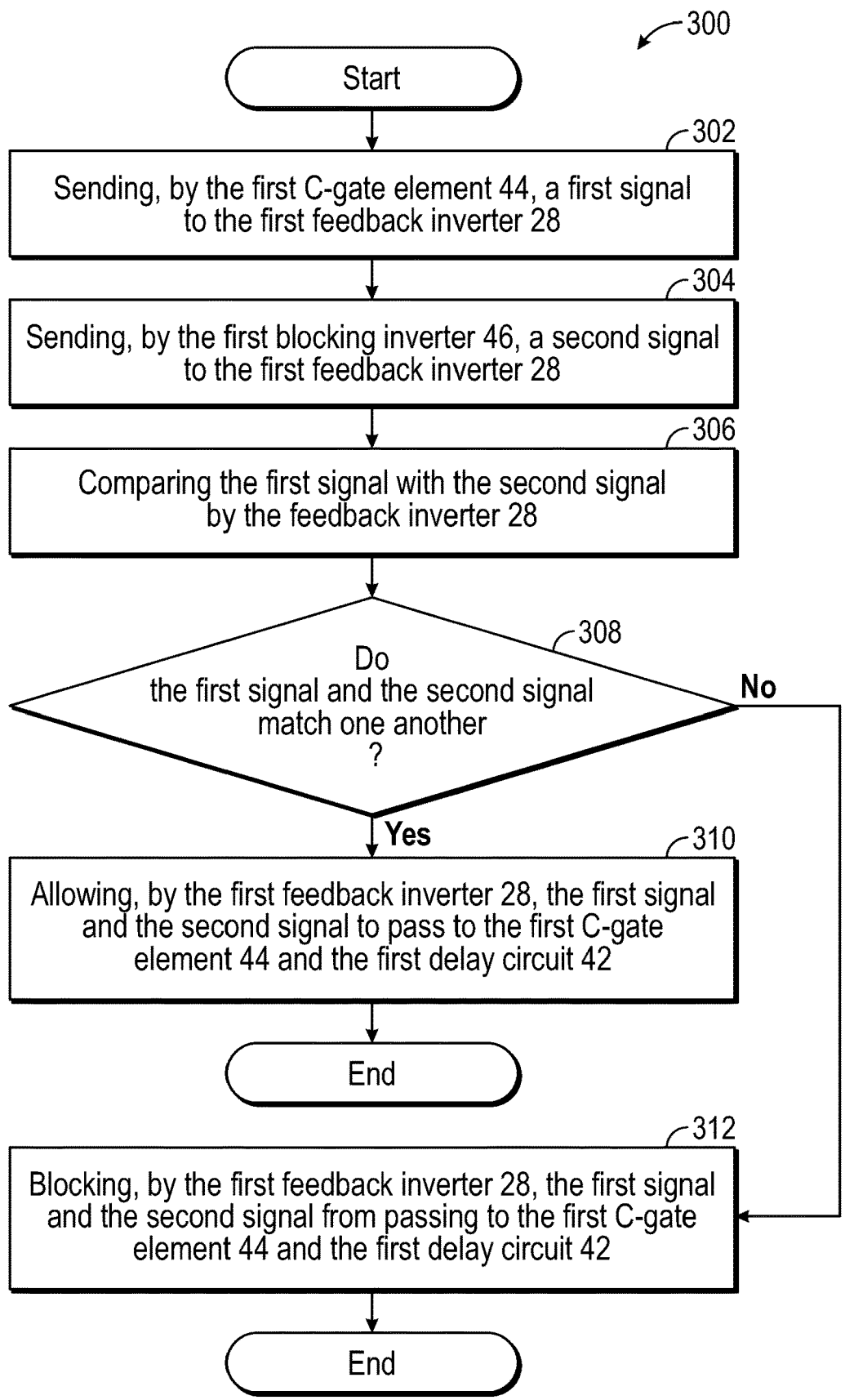
FIG. 4 is an exemplary process flow diagram illustrating a method for blocking a single event transient (SET) in the disclosed flip-flop circuit by a feedback inverter, according to an exemplary embodiment.

FIG. 4 is an exemplary process flow diagram illustrating a method 300 for blocking SETs in the flip-flop circuit 10. Specifically, the method 300 comprises comparing the respective outputs from the first C-gate element 44 and the first blocking inverter 46 with one another by the first feedback inverter 28, where the first feedback inverter 28 allows the respective outputs to pass if the values match one another. It is to be appreciated that while FIG. 4 describes comparing the respective outputs from the first C-gate element 44 and the first blocking inverter 46 with one another by the first feedback inverter 28, the method 300 may also be used to compare the respective outputs of the second C-gate element 124 and the second blocking inverter 126 of the second stage latch 14 as well. Furthermore, it is also to be appreciated that method 300 applies during the portion of the clock cycle where the CLK input and the inverted clock input NCLK of the flip-flop circuit 10 cause the transistors 90, 92, 94, 96, 98, 100 in the first feedback inverter 28 and the transistors 190, 192, 194, 196, 198, 200 in the second feedback inverter 32 to conduct. For the first stage latch 12, this happens when the clock input CLK is high and the inverted clock input NCLK is low, and for the second stage latch 14, this happens when the clock input CLK is low and the inverted clock input NCLK is high. However, during the portion of the clock cycle when the transistors of the first and second feedback inverters 28, 32 do not conduct, the first and second latches 12, 14 are transparent (i.e., the output of the latches 12, 14 are determined based on the input).

Referring to both FIGS. 2 and 4, the method 300 begins at block 302. In block 302, the first C-gate element 44 sends a first signal to the first feedback inverter 28. The method 300 may then proceed to block 304.

In block 304, the first blocking inverter 46 sends a second signal to the first feedback inverter 28. As mentioned above, the first blocking input 72 of the first blocking inverter 46 and the second input 60B of the first C-gate element 44 are both coupled to the first delay output 49 of the first delay circuit 42. The method 300 may then proceed to block 306.

In block 306, the first feedback inverter 28 compares the first signal generated by the first C-gate element 44 with the second signal generated by the first blocking inverter 46. The method 300 may then proceed to a decision block 308.

In the decision block 308, if the first signal and the second signals match one another, then the method 300 proceeds to block 310. In block 310, in response to determining the first signal and the second signal match one another, the first feedback inverter 28 allows the first signal and the second signal to pass to the first C-gate element 44 and the first delay circuit 42. The method 300 may then terminate or, alternatively, return to block 302.

Referring back to the decision block 308, if the first signal and the second signal do not match one another, then the method 300 proceeds to block 312.

In block 312, in response to determining the first signal and the second signal are different from one another, the first feedback inverter 28 blocks the first signal and the second signal from passing to the first C-gate element 44 and the first delay circuit 42. The method 300 may then terminate or, alternatively, return to block 302.

Referring generally to the figures, the disclosed flip-flop circuit provides the power benefits of a filtered radiation hardened circuit while still mitigating SETs that are generated in the interleaved filter. The feedback inverter of the flip-flop circuit ensures that transients generated in either the C-gate element or the blocking inverter of the interleaved filter are not propagated through the flip-flop circuit and captured as SEUs. It is to be appreciated that the blocking inverter is spatially separated from the C-gate element. Accordingly, a radiation event may not strike the blocking inverter and the C-gate element simultaneously. Thus, the disclosed architecture of the flip-flop circuit may be employed with bulk FinFET technologies.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A flip-flop circuit, comprising:
    a pass gate comprising a clock input and an inverting clock input;
    a feedback inverter including a feedback input coupled to both the clock input and the inverting clock input of the pass gate; and
    an interleaved filter, wherein the feedback inverter and the interleaved filter are part of a first stage latch of the flip-flop circuit, the interleaved filter comprising:
        a delay circuit including a delay output;
        a C-gate element including a C-gate input and a C-gate output, wherein the C-gate input is coupled to the delay output of the delay circuit and an input of the first stage latch, and the C-gate output is coupled to the feedback input of the feedback inverter; and
        a blocking inverter including a blocking input and a blocking output, wherein the blocking input is coupled to the delay output of the delay circuit, and the blocking output is coupled to the feedback input of the feedback inverter.

2. The flip-flop circuit of claim 1, wherein the feedback inverter includes a first pair of transistors coupled to the C-gate output of the C-gate element.

3. The flip-flop circuit of claim 2, wherein the feedback inverter includes a second pair of transistors coupled to the clock input and the inverting clock input of the flip-flop circuit.

4. The flip-flop circuit of claim 3, wherein the second pair of transistors include a p-type transistor and an n-type transistor.

5. The flip-flop circuit of claim 4, wherein the p-type transistor of the second pair of transistors is coupled to the inverting clock input of the flip-flop, and the n-type transistor of the second pair of transistors is coupled to the clock input of the flip-flop.

6. The flip-flop circuit of claim 4, wherein the p-type transistor is a p-type metal-oxide-semiconductor field-effect transistor (MOSFET) and the n-type transistor is an n-type MOSFET.

7. The flip-flop circuit of claim 4, wherein the feedback inverter includes a third pair of transistors that are coupled to the blocking output of the blocking inverter.

8. The flip-flop circuit of claim 4, wherein the feedback inverter is configured to:
    compare respective outputs from the C-gate element and the blocking inverter;
    in response to determining the respective outputs match one another, allow the respective outputs to pass to respective inputs of the delay circuit and the C-gate element; and
    in response to determining the respective outputs are different from one another, block the respective outputs from passing to the respective inputs of the delay circuit and the C-gate element.

9. The flip-flop circuit of claim 1, wherein the input of the first stage latch connects to the C-gate element.

10. The flip-flop circuit of claim 9, further comprising a second interleaved filter and a second feedback inverter that are both part of a second stage latch of the flip-flop circuit, wherein an output of the first stage latch is coupled to an input of the second stage latch.

11. The flip-flop circuit of claim 10, wherein the second interleaved filter comprises:
    a second delay circuit including a second delay output; and
    a second C-gate element including a second C-gate input and a second C-gate output, wherein the second C-gate input is coupled to the second delay output of the second delay circuit and the input of the second stage latch, and the second C-gate output is coupled to a second feedback input of the feedback inverter.

12. The flip-flop circuit of claim 11, wherein the second interleaved filter comprises:
    a second blocking inverter including a second blocking input and a second blocking output, wherein the second blocking input is coupled to the second delay output of the second delay circuit, and the second blocking output is coupled to the second feedback input of the second feedback inverter.

13. The flip-flop circuit of claim 12, wherein the second feedback inverter comprises a first pair of transistors coupled to the second C-gate output of the second C-gate element.

14. The flip-flop circuit of claim 13, wherein the second feedback inverter comprises a second pair of transistors coupled to the clock input and the inverting clock input of the flip-flop circuit.

15. The flip-flop circuit of claim 14, wherein a pass gate couples the first stage latch to the second stage latch.

16. The flip-flop circuit of claim 14, further comprising a third pair of transistors coupled to the second blocking output of the second blocking inverter.

17. The flip-flop circuit of claim 1, wherein the C-gate element is spatially separated from the blocking inverter by at least twice the charge collection radius of a radiation event.

18. The flip-flop circuit of claim 1, wherein the C-gate output and the blocking inverter include respective matching delays.

19. A method for blocking a single event transient (SET) in a flip-flop circuit, the method comprising:

sending, by a C-gate element, a first signal to a feedback inverter, wherein the C-gate element includes a C-gate input and a C-gate output;

sending, by a blocking inverter, a second signal to the feedback inverter, wherein the blocking inverter includes a blocking input and a blocking output, and wherein the blocking input of the blocking inverter and the C-gate input are both coupled to a delay output of a delay circuit;

comparing, by the feedback inverter, the first signal with the second signal, wherein a feedback input of the feedback inverter is coupled to the C-gate output of the C-gate element and the blocking output of the blocking inverter; and in response to determining the first signal and the second signal are different from one another, blocking the first signal and the second signal from passing to the C-gate element and the delay circuit.

20. The method of claim 19, further comprising:

in response to determining the first signal and the second signal match one another, allowing the first signal and the second signal to pass to the C-gate element and the delay circuit.

\* \* \* \* \*